United States Patent

[11] 3,573,495

[72] Inventor Melvin P. Xylander
Apalachin, N.Y.

[21] Appl. No. 755,069
[22] Filed Aug. 26, 1968
[45] Patented Apr. 6, 1971

[73] Assignee International Business Machines Corporation
Armonk, N.Y.

[54] THRESHOLD CIRCUIT APPARATUS EMPLOYING INPUT DIFFERENTIAL AMPLIFIER FOR TEMPERATURE STABILIZING THE THRESHOLD LENEL THEREOF
6 Claims, 6 Drawing Figs.

[52] U.S. Cl. .......... 307/235, 307/310, 328/146, 328/150, 330/23, 330/30
[51] Int. Cl. .......... H03k 5/20
[50] Field of Search .......... 307/235, 310; 330/30, 23, 30 (D), 69; 328/146, 150, 115

[56] References Cited

UNITED STATES PATENTS

| | | | |
|---|---|---|---|
| 3,290,520 | 12/1966 | Wennik | 330/30X |
| 3,309,538 | 3/1967 | Ashley et al. | 330/30X |
| 3,381,141 | 4/1968 | Millon | 307/235 |
| 3,418,592 | 12/1968 | Solomon et al. | 330/23 |
| 3,461,318 | 8/1969 | Ordower | 330/30X |
| 3,471,794 | 10/1969 | Gugliotti, Jr. | 330/23 |
| 3,480,872 | 11/1969 | Breuer | 330/30 |

*Primary Examiner*—Stanley D. Miller, Jr.
*Attorneys*—Hanifin and Jancin and Norman R. Bardales

ABSTRACT: The gain of a difference amplifier is controlled as a function of temperature to offset variations, which are due to temperature changes, in the threshold level of a threshold device.

Patented April 6, 1971

3,573,495

2 Sheets-Sheet 1

INVENTOR
MELVIN P. XYLANDER

BY Norman R. Bardales
ATTORNEY

THRESHOLD CIRCUIT APPARATUS EMPLOYING INPUT DIFFERENTIAL AMPLIFIER FOR TEMPERATURE STABILIZING THE THRESHOLD LENEL THEREOF

BACKGROUND OF THE INVENTION

This invention relates to threshold circuit apparatus and more particularly to temperature-stabilized threshold circuit apparatus.

Threshold devices, as is well known, are generally used to detect the level of an input signal with respect to some predetermined reference level. More particularly, these devices generate an output signal whenever the level of the input signal is above the threshold level of the particular device. The threshold level of these devices, however, are sensitive to ambient temperature changes. A lowering or raising of the threshold level resulting from these temperature changes adversely affects the reliability of the device. For example, in the case where the threshold level is lowered from its nominal value, input signals having input levels lower than the nominal value but greater than the lower threshold value falsely trigger the device causing it to produce an erroneous output signal. On the other hand, where the threshold level is raised above its nominal value, then those input signals which have an input level greater than the nominal value but less than the value associated with the raised threshold level go undetected by the device and thereby also adversely affect its reliability. In one particular application, for example, threshold devices are utilized as part of the sensing circuitry associated with the magnetic readout system of a data processor. The amplitude levels of the binary signals being sensed from the memory have preselected values which within certain tolerances are compatible to the nominal threshold level of the corresponding threshold devices utilized to sense their presence. These devices become highly unreliable if there is a wide range of ambient temperatures in which the data processor will operate, such as for example, a temperature range of −55° C. to +125° C. While in the past there have been various techniques devised for providing temperature stabilization of threshold devices, generally these provide temperature stabilization in a very narrow range, are complex, and/or require precision temperature-stabilized circuit elements thereby increasing the cost of such devices.

SUMMARY OF THE INVENTION

It is an object of this invention to provide a temperature-stable threshold circuit apparatus which is relatively inexpensive and/or simple.

It is another object of this invention to provide a temperature-stable threshold circuit apparatus which is temperature stable over a wide temperature range.

Still another object of this invention is to provide a temperature-stable sensing switch for a magnetic storage readout system.

Other objects of this invention are to provide a temperature-stable threshold circuit apparatus which is readily implemented as a monolithic integrated circuit and/or requires no special temperature-stabilized precision elements.

In accordance with one aspect of the invention there is provided threshold circuit means having a threshold level responsive to the temperature in a predetermined temperature range. Difference amplifier means having a gain responsive to the temperature in the predetermined temperature range is coupled to the threshold circuit means. A control means is provided for controlling the gain of the difference amplifier means as a function of temperature to offset the threshold level variations due to temperature changes and provide the apparatus with a substantially constant sensing level for the predetermined temperature range.

The foregoing and other objects, features, and advantages of the invention will be apparent from the following more particular description of the preferred embodiment of the invention as illustrated in the accompanying drawings.

BRIEF DESCRIPTION OF THE DRAWING

In the FIGS., like elements are designated with similar reference numerals.

DESCRIPTION OF THE PREFERRED EMBODIMENT

Figure 1:
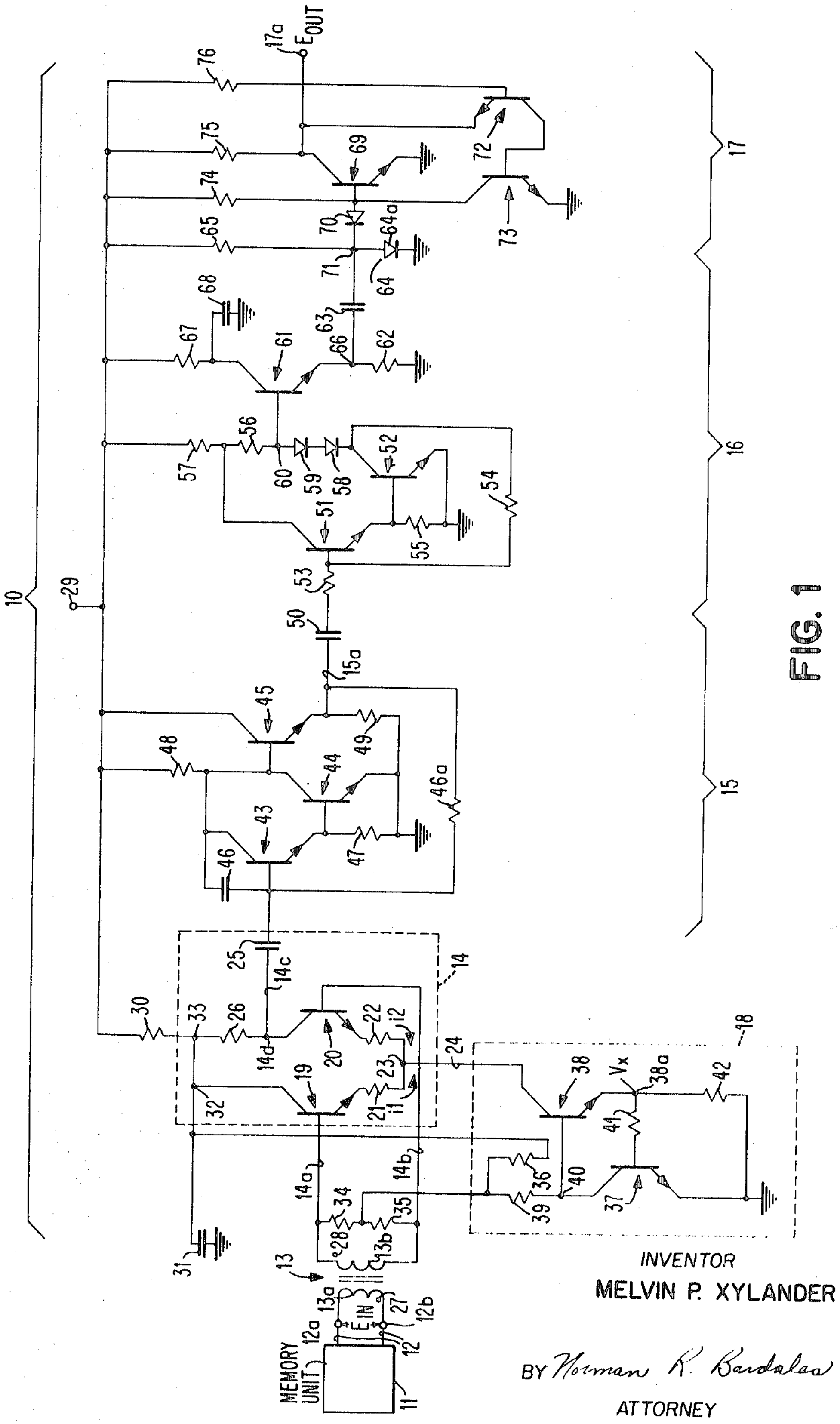
FIG. 1 is a schematic view of a preferred embodiment of the invention.

Referring to FIG. 1 the invention is illustrated therein as being preferrably embodied in a sense switch generally indicated by the reference numeral 10. The switch 10 is preferably part of a data processor readout system that is adapted to read out the magnetic storage elements, not shown, of a memory unit 11 illustrated in block form for sake of explanation. By way of example, the memory unit 11 comprises a multiplanar array of storage elements. For each plane there is provided a sense winding which links all of the storage elements of the particular plane. For sake of clarity, only one such sense winding 12 and its associated sense switch 10 are shown in FIG. 1. More particularly, the ends 12*a*, 12*b* of winding 12 are coupled via transformer 13 to the inputs 14*a*, 14*b* of a semiconductor difference amplifier stage indicated generally by the block 14 shown in dash outline form and described in greater detail hereinafter. It is to be understood that the other sense windings, not shown, would be connected to the other sense switches, not shown, each of which switches are similar to switch 10. In addition, addressing means, not shown, are provided for selecting the desired storage element to be read out in a manner well known to those skilled in the art. For purposes of explanation, each sense switch is described as being mutually exclusively associated with one sense winding. However, as is well known to those skilled in the art, a single sense switch may be commonly associated with two or more of the sense windings by utilizing appropriate addressing techniques, e.g. time division, and/or providing appropriate switching means so that the sense switch services the two or more associated sense windings.

The output 14*c* of the difference amplifier stage 14 is coupled via amplifier stages, indicated generally by the reference numerals 15, 16, to a threshold circuit stage which is also indicated generally by the reference numeral 17. A constant current source indicated generally by the block 18, shown in dash outline form, provides the current for the difference amplifier stage 14. Each of the circuits 14—18 will now be described in greater detail.

The difference amplifier stage 14 is configured as a conventional emitter coupled difference amplifier having a pair of matched NPN transistors 19, 20, the respective base electrodes of which are connected to the inputs 14*a* and 14*b*, respectively. The emitter electrodes of transistors 19, 20 are connected, respectively, to equal resistors 21, 22, the latter being connected commonly at the junction 23. In turn, junction 23 is connected to the constant current source 18 via conductor 24. A coupling capacitor 25 is shown for sake of explanation as being included in the output 14*c* of the difference amplifier 14. The output 14*c* is connected to the junction 14*d* of the collector electrode of transistor 20 and a suitable output resistor 26. For the particular embodiment shown in FIG. 1, the switch 10 is adapted to sense signals from a memory unit 11 of the type known as read only storage or memory and referred to in the art as ROS. As is well known to those skilled in the art, permanent binary information is written in the storage elements of these devices and generally represents data which does not change but which is frequently utilized in the operation of the associated data processor. In such devices, each time a given storage element is read out it will provide a unipolar signal of the same polarity. The windings 13*a* and 13*b* of transformer 13 are illustrated in FIG. 1 by way of example as having an opposite polarity relationship indicated by the dots 27 and 28, respectively. For this particular polarity relationship, the switch 10 is adapted to sense unipolar input signals of negative polarity, that is an input signal which causes signals of negative polarity to be present at the dots 27, 28, and accordingly the output 14*c* is taken from the collector circuit of transistor 20. If on the other hand, the input signals were of positive polarity then the output 14*c* would be taken from the collector circuit of transistor 19, a suitable output resistor being provided therein for this purpose. In either case, if desired, an output resistor may be provided in both of the collector circuits of transistors 19 and 20; however, since only one output is required for a unipolar input signal operational mode, an output resistor, e.g. resistor 26, in the collector of the transistor circuit from which the output 14*c* is to be taken is sufficient as an output resistor in the collector circuit of the other transistor from which the output 14*c* is not taken is merely superfluous. It should be understood that if the windings 13*a*, 13*b* of transformer 13 had the same polarity relationship then the output 14*c* would be taken from the collector circuit of transistor 19 for negative input signals and from the collector circuit of transistor 20 for positive input signals and at least the particular collector circuit from which the output is taken would be provided with an output resistor for the reasons previously explained. It should be further understood that the switch 10 may be modified to provide a bipolar input signal operational mode as will be discussed hereinafter in connection with reference to FIG. 6.

A common bias source, not shown, is connected to the bias terminal 29 and is connected to a resistor 30 which together with capacitor 31 forms an AC filter. The bias source is connected via resistor 30 to the junctions 32, 33 of the respective collector circuits of transistors 19 and 20, respectively. A pair of series-connected resistors 34, 35 are shunted across the output winding 13*b* of transformer 13. The common bias source also biases the bases of transistors 19 and 20 via the bias arrangement comprising in conjunction with the constant current source 18, the resistors 30, 34—36. Resistor 36 is common also to the bias arrangement of constant current source 18.

The constant current source includes a pair of NPN transistors 37, 38 configured in a shunt feedback relationship. Transistor 37 acts as a grounded emitter inverter and its collector output is connected via resistors 30, 36, 39 to the aforementioned bias supply, not shown, which is connected to terminal 29. The input or base electrode of transistor 38 is also connected to the output of transistor 37 at the junction 40. Transistor 38 is configured as an emitter follower. The collector electrode of transistor 38 is connected to the conductor 24 and its emitter electrode is connected to the base-emitter circuit of transistor 37 via the resistor network comprising resistors 41, 42.

In the preferred embodiment two series-connected amplifier stages 15, 16, provide the means for coupling the output 14*c* of the difference amplifier stage 14 to the input of the threshold circuit stage 17. As is obvious, in those cases where the gain of the difference amplifier stage 14 is sufficient to make the threshold circuit stage 17 responsive to an input signal applied to the input of circuit 10, no amplifier stages are required and the stages 14 and 17 may be directly coupled to each other. Alternatively, more or less amplifier stages may be provided in the circuit 10 for the same purpose and/or if desired one or more amplifier stages may be provided as preamplifiers to the input of circuit 10.

Amplifier stage 15 in the preferred embodiment comprises three cascaded amplifiers shown as NPN transistors 43, 44 and 45. Transistors 43 and 45 are configured as emitter followers and transistor 44 as a grounded emitter amplifier. In addition to providing amplification, stage 15 also integrates the signal from output 14*c*. Integration is achieved by the negative feedback through the capacitor 46 resulting in a gain of the stage 15 which is inversely proportional to the frequency of the last-mentioned signal.

At very low frequencies, without further modification, the gain of stage 15 is extremely high. In order to eliminate any adverse affects due to noise generated within the transistors, the gain of stage 15 is "rolled" off at low frequencies, that is to say, is attenuated. This is achieved by the provision of a secondary feedback path comprising resistor 46*a* which is connected from the emitter output of transistor 45 to the base input of transistor 43. This allows a maximum limit in the gain of the amplifier and thus prevents the low frequency gain from exceeding a fixed value in a manner well known to those skilled in the art.

The gain of stage 15 is primarily controlled by the value of the capacitor 46. By judiciously selecting a capacitor whose value is not adversely affected due to temperature changes, the gain of stage 15 remains essentially constant over a wide temperature range.

Resistors 47, 48 and 49 are part of the biasing arrangement for the transistors 43—45 of stage 15. The output 15*a* of stage 15 is shown as comprising, for sake of explanation, a coupling capacitor 50 and is connected to the input of the succeeding amplifier stage 16.

Stage 16 provides linear amplification of the integrated signal present at the output 15*a* and comprises a pair of NPN transistors 51, 52 configured as an emitter-follower and grounded emitter amplifier, respectively. The base input of transistor 51 is connected via resistor 53 to the output 15*a* and is also connected to the feedback resistor 54 from the collector of the transistor 52. Resistors 55, 56 and 57 are part of the biasing arrangement associated with transistors 51, 52. Diodes 58, 59 are provided to raise the DC level of the output signal appearing at junction 60. As a result, the output voltage at junction 66 of the subsequent NPN transistor 61, which is configured as an emitter follower and is part of a DC restore circuit hereinafter described, is permitted to have a sufficient voltage swing to operate the threshold circuit 17.

The gain of stage 16 is controlled primarily by the ratio of resistors 53 and 54. Over a wide temperature range, the absolute values of resistors 53 and 54 may change appreciably, but the ratio will remain essentially constant and thus the gain of stage 16 also remains constant.

The aforementioned DC restore circuit is shown in FIG. 1 as part of stage 16 for sake of explanation and comprises the elements 61—65. The DC restore circuit is provided to return, i.e. clamp, the voltage at the anode 64*a* of the diode 64 to the same reference level after each cycle of operation. More specifically, the RC time constant for a negative going signal applied to the anode 64*a* of diode 64 will be very long. This occurs because during the application of the negative going signal diode 64 is reverse biased and the RC time constant is principally controlled by capacitor 63 and resistor 65. On the other hand, the positive going signal applied to the anode of diode 64 will have a very short RC time constant because under these conditions the diode 64 is forward biased and the time constant is principally controlled by capacitor 63 and the forward impedance of the diode 64. For the particular negative input signal applied to the input of the switch 10 at winding 13*a*, the forward or leading edge of the signal appearing at the junction 66 in response thereto will be negative going and is thus coupled or fed through capacitor 63 almost unimpeded. On the other hand, as the trailing edge of the signal appearing at the junction 66 tries to rise above the reference or clamping level, the time constant becomes very short and the voltage appearing at the anode 64*a* is quickly restored to the reference level, which is substantially equal to the forward bias voltage across diode 64. Resistor 67 and capacitor 68 comprise an AC filter similar to the aforementioned resistor 30 and capacitor 31.

In the preferred embodiment, the threshold circuit stage 17 comprises a grounded emitter NPN switching amplifier 69.

The base input electrode of transistor 69 is connected to the junction 66 via the series-connected capacitor 63 and diode 70 from which the threshold level of stage 17 is derived. Also connected to the input, i.e. base electrode, of transistor 69 via the normally nonconducting diode 70 is the junction 71 of capacitor 63, resistor 65 and anode 64*a* of diode 64. As a consequence, capacitor 63 connects junction 66 to the input of stage 17 at junction 71. In the particular embodiment shown in FIG. 1, a latch comprising a pair of cascaded NPN transistors 72, 73 are connected between the collector and base electrodes of transistor 69. The output of the stage 17 is provided at terminal 17*a* which is coupled to the collector electrode of transistor 69. Resistors 74, 75, 76 coact with the bias supply, not shown, at terminal 29 to provide biasing for the transistors 69, 73, 72 and diode 70.

During quiescence, the base-emitter voltage of transistor 69 is substantially identical to the drop across the diode 64. Under this condition, diode 70 is nonconducting and substantially has no potential difference across it. Also, under this condition, transistor 69 is forward biased by resistor 74 and is in a saturated condition, i.e. conducting. Transistor 69 is taken out of saturation, i.e. placed in a nonconductive condition, by causing diode 70 to become forward biased. This is accomplished by feeding a negative signal from junction 66 through capacitor 63 with sufficient voltage level or amplitude to overcome the forward bias voltage of diode 70. Thus, any signal less than this amplitude will be rejected and any signal above this amplitude will be coupled through diode 70 and cause transistor 69 to be cut off.

With no signal present at the junction 66 or in the presence of a signal thereat with a voltage level insufficient to overcome the bias voltage of diode 70, transistors 69 and 72 are saturated and transistor 73 is cut off. The output signal is, under these conditions, at a level hereinafter sometimes referred to as its normal output level. When a signal appears at junction 66 that is of sufficient magnitude to cause transistor 69 to become cut off, the output voltage level at terminal 17*a* changes to a different level which causes transistor 72 to be cut off. Under this condition, base current is supplied to transistor 73 by way of resistor 76 and the base-collector junction of transistor 72, thus causing transistor 73 to become saturated, i.e. conductive. The saturation drop across transistor 73 is sufficiently low to keep transistor 69 in a cutoff condition indefinitely and thus results in the output of terminal 17*a* being latched.

The latch is reset externally by collector pullover when the signal level at junction 66 falls below the threshold level of the stage 17 and more specifically when the signal level at junction 66 drops below a level which causes diode 70 to revert to its normally nonconductive condition. When this occurs, transistor 69 again becomes conductive and its collector voltage level, and consequently the output voltage level at terminal 17*a* returns to its normal output level. The pullover of the collector voltage level associated with the change from the nonconductive condition to the conductive condition of transistor 69 results in the complementary turn-on and turnoff conditions of transistors 72 and 73, respectively.

The temperature stabilizing and compensating aspects of the present invention will now be described in conjunction with the operational description of the circuit of FIG. 1. During quiescence, that is, in the absence of a negative input signal E*in* applied to the input winding 13*a* of transformer 13, transistors 19 and 20 of difference amplifier stage 14 are conducting as well as the transistors 37, 38 of constant current source or sink, i.e. stage 18. The constant current source 18 allows the operating currents *i*1 and *i*2 of the difference amplifier transistors 19, 20 to remain constant. These currents *i*1 and *i*2 are independent of the collector loads of their respective transistors 19, 20 and in the quiescent condition are balanced, i.e. equal. The emitter-collector current of conducting transistor 37 establishes a voltage *Vx* at the junction 38*a* of the emitter electrode of transistor 38 and the resistors 41, 42. The voltage *Vx* is a control voltage which controls the magnitude of the current levels of currents *i*1, *i*2. The voltage level established at the junction 14*d*, after amplification by the stages 15 and 16, produces a voltage level at the junction 71 which maintains the diode 70 in its aforementioned normally nonconducting condition during quiescence, thus resulting in the transistor 69 being in a state of conduction as previously explained.

The voltage level of voltage *Vx* is temperature dependent due to the base-emitter characteristics of transistor 37. However, variations in the magnitude of the emitter-collector current of transistor 37 have a negligible affect in the change of voltage *Vx*. During quiescence, if the temperature changes there is a corresponding change in the magnitude of the currents *i*1, *i*2 which, however, still remain balanced or equal. The change in the magnitude of the currents *i*1, *i*2 due to temperature changes during quiescence is such that the voltage level at the junction 71 still maintains the diode 70 in a nonconducting condition and consequently does not exceed the threshold level of stage 17 which is also temperature sensitive.

When a unidirectional negative input signal is applied to the winding 13*a*, the difference amplifier stage is unbalanced. The currents *i*1 and *i*2 change in a complementary manner such that the current *i*1 decreases and the current *i*2 increases. As a consequence, the voltage levels at junctions 14*d* and 71 cause diode 70 to be forward biased and the transistor 69 to be cut off as previously explained.

Figure 2:
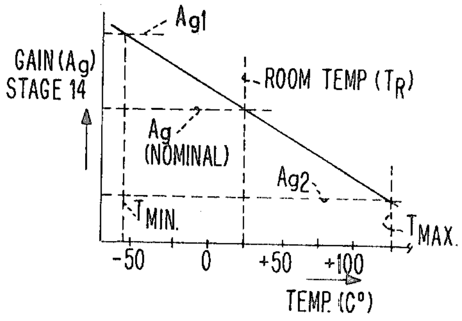
FIGS. 2 and 3 are the gain and threshold level versus temperature characteristics of the difference amplifier and threshold circuits, respectively, of FIG. 1.

In order to compensate for the changes in the threshold level of the threshold stage 17 due to temperature changes, in accordance with the principles of the present invention the gain of the difference amplifier stage 14 is controlled as a function of temperature to offset the threshold level changes. More particularly, as previously explained, stages 15 and 16 have relatively constant gains over a wide temperature range. The difference amplifier stage 14, however, has a relatively wide variation in gain as indicated by the idealized gain versus temperature characteristic waveform shown in FIG. 2. Similarly, the threshold circuit stage 17 also has a wide variation in threshold levels as shown by the idealized threshold level versus temperature characteristic waveform shown in FIG. 3.

Figure 4:
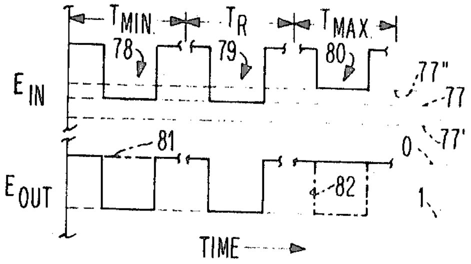
FIG. 4 is a waveform diagram of the input and output signals of the circuit of FIG. 1.

For purposes of explanation, there is shown in FIG. 4 idealized waveforms for the respective signals E*in*, E*out* for three different temperatures T*min*, T*r*, and T*max;* wherein T*r* corresponds to room temperature and T*min* and T*max* are temperatures above and below room temperature, respectively, and more particularly to the lower and upper extremities of the expected temperature range. In accordance with the present invention, the temperature stabilizing and compensating effects produced thereby provides a reliable output signal E*out* whenever the input signal E*in* is at and/or above a predetermined sensing level which is indicated by the dash line 77, FIG. 4. Thus, in the preferred embodiment where the sense switch 10 is utilized to indicate the binary state of a storage element being read out, at temperature T*min* the level of the first pulse 78 of signal E*in* is illustrated for purposes of explanation as being at, i.e. coincident with, the level 77. As a result, the normal output level of the signal E*out* which represents a preselected one of the binary states, e.g. a binary 0, changes to a level which represents the other binary state, e.g. a binary 1. Likewise, at temperature T*r* the level of input pulse 79, which is also illustrated for purposes of explanation as being coincident with the level 77, causes the level of the output signal E*out* to switch from its normal output level to the output level that is indicative of the other binary state, e.g. a binary 1. At temperature T*max*, the level of the input pulse 80 is below the sensing level 77 and correspondingly the level of the output signal E*out* remains at its normal output level, e.g. a binary 0.

Without the temperature stabilizing and compensating aspects of the present invention, the sensing level 77 would not be constant, and at temperatures T*min* and T*max* sensing levels would change as represented by the lines 77′ and 77″, respectively, as shown in FIG. 4. Thus, the first pulse 78 of signal E*in*, the level of which is below the sensing level 77′, would cause the level of the output signal E*out* erroneously to remain at the binary 0 level as indicated by the dash-dot line 81. Likewise, without the temperature stabilizing and compensating aspects of the present invention, at temperature T*max* the pulse 80 of signal E*in*, which is illustrated for purposes of explanation as being coincident with the sensing level 77″, would cause the output level of the signal E*out* to switch erroneously from its normal output level to a binary 1 level as shown by the pulse 82 illustrated in dash-dot outline form.

Figure 3:
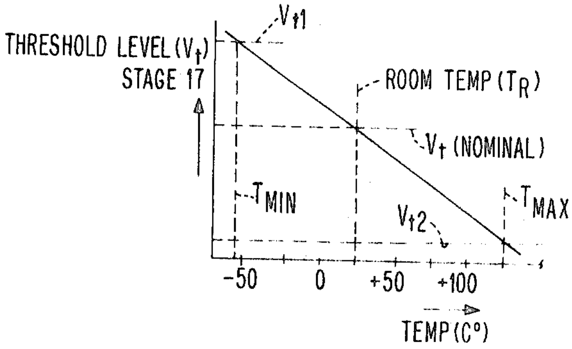

The variation in the gain of the difference amplifier stage 14 and the variation in the threshold level of the threshold circuit stage 17, due to changes in temperature, are both predictable; cf. FIGS. 3, 4. In accordance with the principles of the present invention, the ratio of the threshold levels over a given temperature range and the ratio of the difference amplifier gain over the same temperature range are made equal so as to provide a cancellation effect whereby the gain of the circuit 10 is maintained relatively constant over the given temperature range. The following mathematical analysis is provided to demonstrate the foregoing principles.

Figure 5:
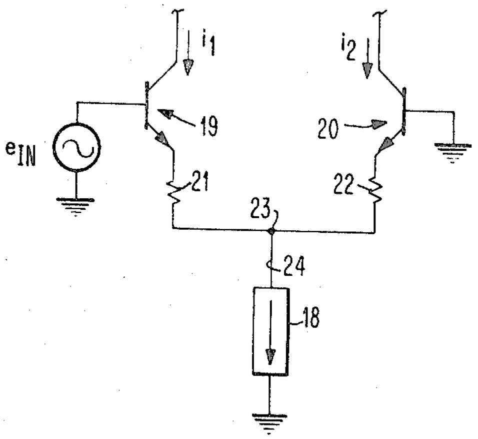
FIG. 5 is a schematic view of a simplified equivalent AC circuit of the difference amplifier and constant current source of the circuit of FIG. 1.

In FIG. 5 there is illustrated an equivalent AC circuit of the difference amplifier stage 14 and the constant current source 18. For the matched transistors 19 and 20, their respective equations for transconductance gain *Ag* are equal. With the equal resistors 21, 22, the equation of the gain *Ag* for each of the transistors 19 and 20 of stage 14 written in conventional hybrid parameters may be simplified as follows:

(1) $$Ag=\frac{1}{2hib+2R}\times\frac{hfe}{hfe+1}$$

where *hib* = the hybrid input impedance of a common base configuration

*hfe* = the hybrid forward current gain ratio of a common-emitter configuration

*R* = resistance value of the particular resistor 21, 22.

When *hfe*>> 1, equation (1) is further simplified as follows:

(2) $$Ag=\frac{1}{2hib+2R}$$

Thus, the major control of the gain *Ag* is due to the parameters *hib* and *R*.

The value of the parameter *hib* is a function of the physics of the particular transistor and it is very nearly independent of the transistor type or material. The equation for this parameter is as follows:

(3) $$hib=\frac{KT}{qIE}$$

where *K* = Boltzman's Constant = $1.38\times10^{123}$ joules/°Kelvin

*q* = Electronic charge = $1.60\times10^{119}$ coulombs

*T* = Temperature in degrees Kelvin

*IE* = DC emitter current in amperes

The values of the terms *K* and *q* are constants and the only variables are the temperature *T* and emitter current *IE* terms. Small temperature changes do not affect the value of the parameter *hib* appreciably. However, over a wide temperature variation such as the temperature range −55° C. to +125° C. a substantial change in the value of the parameter *hib* occurs. Thus, the gain *Ag* is controlled by judiciously selecting the values of the emitter current *IE* in equation (3) and of the resistance *R* in equation (2).

Referring now to the constant current source 18, transistors 37 and 38 are connected as aforementioned in a shunt feedback configuration. This circuit has the characteristic that the collector current of transistor 38 is controlled primarily by the base-emitter voltage of transistor 37 and resistor 42. The characteristic of the base-emitter voltage of a transistor is that it changes with temperature at a predictable rate. For example, a typical value of a silicon transistor is approximately equal to −2 millivolts per degree centigrade. For such a transistor, at room temperature, e.g. +25° C., the base-emitter voltage will be approximately 700 millivolts. At +125° C. it will be approximately 500 millivolts and at −55° C., it will be approximately 860 millivolts.

The voltage *Vx* is substantially equal to the base-emitter voltage of transistor 37. Accordingly, the DC emitter current of transistor 38, which is equal to the sum of the operating currents *i*1, *i*2, may be calculated from the following equation:

(4) $$IE=i1+i2=\frac{Vx}{R'}$$

where *R′* = resistance value of resistor 42. The resistance value *R′* is judiciously selected such that its value at room temperature causes the operating currents *i*1, *i*2 to be at a predetermined optimum level. Substitution of equation (4) into equation (3) results in the following equations:

(5) $$hib-\text{max.}=\frac{KT_{\text{max.}}}{qIE}$$

and (6) $$hib-\text{min.}=\frac{KT_{\text{min.}}}{qIE}$$

where *hib-max* and *hib-min* are the hybrid input impedances of a common base configuration at the temperatures T*max* and T*min*, respectively.

The ratio of the transconductance gains at the temperature extremes of the temperature range T*min*, T*max* derived from equations (1)—(6) may be written as follows:

(7) $$\frac{Ag1}{Ag2}$$

where *Ag*1 = the transconductance gain at temperature T*min*

*Ag*2 = the transconductance gain at temperature T*max*.

As previously explained, the threshold level *Vt* of the threshold stage 17 is substantially determined by the voltage required to forward bias diode 70. Changes in the forward voltage drop of a diode due to temperature changes are predictable. For example, a silicon diode has the characteristic that the forward voltage drop changes at a rate very nearly equal to −2 millivolts per degree centigrade which is the same as the rate for the base-emitter voltage of a silicon transistor. Therefore, in the silicon diode example at −55° C. the forward voltage drop and consequently the threshold level is 860 millivolts, and at +125° C. the forward voltage drop and corresponding threshold level is 500 millivolts. As aforementioned, in the present invention the ratio of the threshold levels and the ratio of the transconductance gains over the contemplated temperature range are made equal in order to provide cancellation of the effects of the variation in gain of the difference amplifier stage 14 and the variation in the threshold level of the threshold stage 17, and is expressed in the following equation:

(8) $$\frac{Vt1}{Vt2}=\frac{Ag1}{Ag2}=\frac{\frac{1}{2hib-\text{min.}+2R}}{\frac{1}{2hib-\text{max.}+2R}}$$

where *Vt*1 and *Vt*2 are the threshold levels of the threshold stage 17 at temperatures T*min* and T*max*, respectively.

Solution and substitution of the equations and expressions (1)–(8) results in the calculation of the resistance value *R* for each of the resistors 21, 22. The resistance value *R* of each of the resistors 21, 22 may be further modified to compensate for secondary temperature affects, such as the temperature coefficient of the resistors, changes in the hybrid forward current gain ratio *hfe* due to temperature changes, and/or imperfections in the circuit components. Thus, the aforedescribed temperature compensation will result in the sensing level 77, FIG. 4, of the circuit 10 remaining constant over the entire temperature range. The circuit of the invention thus requires no gain adjustment and has good temperature stability. In addition, the circuit has a high voltage gain, requires only one power source, has very little power dissipation, and has good gain stability which allows it to be fabricated as a monolithic structure having relatively poorly toleranced monolithic components.

Typical values for the monolithic and discrete components of an integrated circuit of FIG. 1 are indicated in Table I, as follows:

TABLE I

| | |
|---|---|
| Monolithic components: | |
| Resistors 21, 22 | 36 ohms each |
| Resistor 26 | 750 ohms |
| Resistors 30, 34, 35, 67 | 100 ohms each |
| Resistor 36 | 2,000 ohms |
| Resistor 39 | 1,500 ohms |
| Resistors 41, 47, 48, 49, 55, 76. | 1,000 ohms each |
| Resistor 42 | 300 ohms |
| Resistor 46a | 12,000 ohms |
| Resistors 53, 57 | 200 ohms each |
| Resistor 54 | 4,000 ohms |
| Resistors 56, 75 | 800 ohms each |
| Resistor 62 | 500 ohms |
| Resistor 65 | 10,000 ohms |
| Resistor 74 | 48,000 ohms |
| Discrete components: | |
| Capacitors 25, 50 | 0.01 microfarads each |
| Capacitors 31, 68 | 0.1 microfarads each |
| Capacitor 43 | 20 picofarads each |
| Capacitor 63 | 0.001 microfarads each |
| Diode 64 | Type HP2301 |
| Frequency response | 50 megacycles |
| Duty cycle | 100% |
| Cycle time | 200 nanoseconds |
| Temperature range | −55° C. to +125° C. |

In the above example, all the transistors and diodes are monolithic integrated circuit types with the exception of diode 64.

Figure 6:
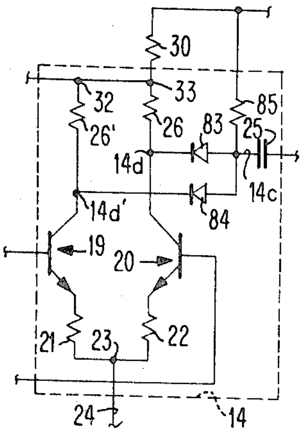
FIG. 6 is a schematic view of another difference amplifier which may be utilized by the circuit of FIG. 1.

Referring now to FIG. 6, there is partially shown a modification of the difference amplifier stage 14 which, when incorporated into the circuit of FIG. 1, allows the latter to be operated with bipolar input signals. Identical components of FIGS. 1 and 6 are identified by the same reference numerals for sake of clarity. Accordingly, as shown in FIG. 6, the output 14*c* is connected to each of the collector electrodes of the transistors 19 and 20 at the junctions 14*d'* and 14*d*, respectively. Since the output is to be taken from the collector electrode of transistor 19, an output resistor 26' is provided between the junctions 14*d'* and 32. For purposes of symmetry, the value of resistor 26' is made equal to that of resistor 26. In order to prevent the output signals appearing at the junctions 14*d*, 14*d'* from adversely affecting each other, a pair of rectifying means, e.g. diodes 83, 84, are connected between the junction 14*d* and output 14*c*, and the junction 14*d'* and output 14*c*, respectively. A common bias resistor 85 biases the diodes 83, 84 and is connected to the power supply, not shown, connected to terminal 29, FIG. 1. The diodes 83, 84 are poled such that when the particular transistor 19 or 20 provides an output voltage at its associated junction 14*d'* or 14*d*, as the case may be, the diode connected to that particular junction will be forward biased and the diode connected to the other junction will be reverse biased as is obvious to those skilled in the art.

It should be understood that while the invention has been described with particular NPN transistor types and input/output electrode configurations thereof, that the invention could be practiced with PNP and/or complementary transistor types and/or other input/output confications in a manner well known to those skilled in the art. It should also be understood that while the invention is preferably embodied as a readout switch for a magnetic storage unit, that the invention may be practiced with other signal level detection apparatus.

Thus, while the invention has been particularly shown and described with reference to a preferred embodiment, it will be understood by those skilled in the art that the foregoing and other changes in form and detail may be made therein without departing from the spirit and scope of the invention.

I claim:

1. In threshold circuit apparatus, the combination comprising:

threshold circuit means having an input and an output associated therewith, the threshold level at said input being responsive to temperature for a predetermined temperature range;

difference amplifier means having a gain responsive to temperature for said predetermined temperature range, said difference amplifier means having:

first and second transistors, each of said transistors having a base, a collector and an emitter electrode, input means coupled to said base electrodes of said transistors, output means coupled between at least one of said collector electrodes and said input of said threshold circuit means, and first and second emitter circuits coupled to said emitter electrode of said first transistor and said emitter electrode of said second transistor, respectively, said first and second emitter circuits having first and second equal resistance resistors, respectively, serially coupled to said first and second electrodes, respectively; and a constant current source circuit means coupled to said first and second circuits for providing emitter circuit currents through said resistors of said first and second emitter circuits, said constant current source circuit means controlling the gain of said difference amplifier means as a function of temperature to offset the threshold level variations at said input of said threshold circuit means so as to provide said apparatus with a constant sensing level for said predetermined temperature range in accordance with the following relationship:

$$\frac{Ag\ 1}{Ag\ 2}=\frac{Vt1}{Vt2}=\frac{\dfrac{1}{2\dfrac{KTa}{qIE}+2R}}{\dfrac{1}{2\dfrac{KTb}{qIE}+2R}}$$

where $Ag1$ = the gain of said difference amplifier means at a predetermined first temperature of said range, $Ag2$ = the gain of said difference amplifier means at a predetermined different second temperature of said range, $Vt1$ = the threshold level of said threshold circuit means at said first temperature, $Vt2$ = the threshold level of said threshold circuit means at said second predetermined temperature, $K$ = Boltzman's constant, $q$ = electron charge constant, $Ta$ = said first temperature, $Tb$ = said second temperature, $IE$ = the sum of the DC current provided by said constant current source circuit means to the emitter electrodes of said first and second transistors through said first and second resistors, and $R$ = said resistance value of one of said first and second resistors.

2. Threshold circuit apparatus according to claim 1 wherein said first and second predetermined temperatures are the lower and upper temperature extremities, respectively, of said range.

3. Threshold circuit apparatus according to claim 2 wherein said lower and upper temperature extremities are −55° C. and +125° C., respectively.

4. Threshold circuit apparatus according to claim 1 wherein said constant current source circuit means comprises:

third and fourth transistors, each of said transistors, having a base, an emitter and a collector electrodes, respectively, the collector electrode of said third transistor being coupled to the base electrode of said fourth transistor;

a third resistor coupled between the base electrode of said third transistor and said emitter electrode of said fourth transistor; and a fourth resistor coupled between the emitter electrodes of said third and fourth transistors, said collector electrode of said fourth transistor being coupled to said first and second resistors and providing thereat said DC emitter current.

5. Threshold circuit apparatus according to claim 3 wherein said apparatus is a sense switch for sensing for a predetermined amplitude level characteristic of input signals applied to said input circuit means of said difference amplifier circuit means, said threshold circuit means providing an output signal at said output having first and second predetermined signal characteristics indicative of the presence and absence, respectively, of the predetermined amplitude level characteristic in the particular said input signal being applied to said input circuit means.

6. Threshold circuit apparatus according to claim 5 further comprising in combination at least one magnetic storage element having sense winding means associated therewith for providing said input signals.